(12) United States Patent
Klostermann et al.

(10) Patent No.: US 7,205,596 B2
(45) Date of Patent: Apr. 17, 2007

(54) ADIABATIC ROTATIONAL SWITCHING MEMORY ELEMENT INCLUDING A FERROMAGNETIC DECOUPLING LAYER

(75) Inventors: Ulrich Klostermann, Fontainebleau (FR); Peter Beer, Fontainebleau (FR); Manfred Ruehrig, Eckental (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/117,713

(22) Filed: Apr. 29, 2005

(65) Prior Publication Data

US 2006/0244021 A1 Nov. 2, 2006

(51) Int. Cl.
*H01L 29/76* (2006.01)
(52) U.S. Cl. ...................... 257/295; 257/422
(58) Field of Classification Search ................ 257/295, 257/422, 427
See application file for complete search history.

(56) References Cited

U.S. PATENT DOCUMENTS

| | | | |
|---|---|---|---|
| 5,686,838 A | 11/1997 | Van Den Berg | |
| 6,531,723 B1 | 3/2003 | Engel et al. | |
| 6,545,906 B1 | 4/2003 | Savtchenko et al. | |
| 6,639,291 B1 * | 10/2003 | Sin et al. .................... | 257/427 |

* cited by examiner

*Primary Examiner*—Doug Menz
(74) *Attorney, Agent, or Firm*—Edell, Shapiro & Finnan, LLC

(57) ABSTRACT

A magnetoresistive memory element includes a stacked structure with a ferromagnetic reference region including a fixed magnetization; a ferromagnetic free region including a free magnetization that is free to be switched between oppositely aligned directions with respect to an easy axis thereof; and a tunneling barrier made of a non-magnetic material. The ferromagnetic reference and free regions and the tunneling barrier together form a magnetoresistive tunneling junction. The ferromagnetic free region includes a plurality of N ferromagnetic free layers being magnetically coupled such that magnetizations of adjacent ferromagnetic free layers are in antiparallel alignment, where N is an integer greater than or equal to two. The ferromagnetic free region further includes at least one ferromagnetic decoupling layer including frustrated magnetization in orthogonal alignment to ferromagnetic free layer magnetizations and being arranged in between adjacent ferromagnetic free layers.

7 Claims, 4 Drawing Sheets

PRIOR ART

ADIABATIC ROTATIONAL SWITCHING MEMORY ELEMENT INCLUDING A FERROMAGNETIC DECOUPLING LAYER

FIELD OF THE INVENTION

The present invention relates to non-volatile semiconductor memory chips and more particularly with magnetoresistive random access memory cells (MRAM cells) for use in a semiconductor integrated circuit.

BACKGROUND

In semiconductor industries, strong efforts are made to bring new promising memory technologies based on non-volatile MRAM cells into practical (commercial) use. An MRAM cell includes a stacked structure of magnetic layers separated by a non-magnetic tunneling barrier layer and arranged into a magnetic tunnel junction (MTJ). Digital information is not maintained by power as in conventional DRAMs, but rather by specific directions of magnetizations (magnetic moments or magnetic moment vectors) in the ferromagnetic layers. More specifically, in an MRAM cell, magnetization of one ferromagnetic layer (called "reference layer" or "pinned layer") is magnetically fixed or pinned, and, magnetization of the other ferromagnetic layer (called "free layer") is free to be switched between two preferred directions along an easy axis (preferred axis) of magnetization thereof, which directions typically are in a same or opposite alignment as to the reference layer's fixed magnetization.

Depending upon the magnetic states of the free layer (i.e., parallel or antiparallel alignment of its magnetization with respect to the magnetization of the reference layer), the magnetic memory cell exhibits two different resistance values in response to a voltage applied across the magnetic tunnel junction barrier, where the resistance thereof is "low" when magnetizations are in parallel alignment and "high" when magnetizations are in antiparallel alignment. Accordingly, logic information corresponding to one logic bit may be assigned to the different magnetizations of the free layer, and a simple detection of electric resistance provides logic information stored in the magnetic memory element.

An MRAM cell is written to through the application of magnetic fields created by bi- or unidirectional currents made to run through current lines arranged adjacent the MRAM cell so that their magnetic fields are coupled to the free layer magnetization. More specifically, if a magnetic field in a direction opposite to the magnetization of the free layer is applied, then magnetization of the free layer is reversed in case a critical magnetic field value is reached, which is also referred to as reversal magnetic field. The value of the reversal magnetic field can be determined from a minimum energy condition. Assuming that a magnetic field applied to the direction of the hard axis of magnetization (that is in orthogonal alignment to the easy axis thereof) is represented by $H_x$ and a magnetic field applied to the easy axis of magnetization is represented by $H_y$, then a relationship $H_x^{(2/3)} + H_y^{(2/3)} = H_c^{(2/3)}$ is established, where $H_c$ represents the anisotropic magnetic field of the free layer. Since this curve forms an astroid on a $H_x$-$H_y$-plane, it is called an astroid curve. Hence, a composite magnetic field enables the selection of a single MRAM-cell in case the sum of both magnetic fields at least amounts to the reversal magnetic field. Based upon such condition, a single MRAM cell can be switched using combined magnetic fields (which is known, for example, as a "Stoner-Wohlfahrt" switching scenario).

Recently, a new concept of MRAM cells has been proposed, in which a ferromagnetic free region includes a plurality of ferromagnetic free layers that are antiferromagnetically coupled, where the number of antiferromagnetically coupled free layers may be appropriately chosen to increase the effective magnetic switching volume of the MRAM device. See, for example, U.S. Pat. No. 6,531,723, European Patent No. 674769 and German Patent Application No. 4243358, the disclosures of which are incorporated herein by reference in their entireties. For switching such magnetoresistive memory cells, another switching scenario, the so-called "adiabatic rotational switching" may be used. An example of this switching technique is described in U.S. Pat. No. 6,545,906, the disclosure of which is incorporated herein by reference in its entirety.

In short, adiabatic rotational switching relies on a "spin-flop" phenomenon, which lowers the total magnetic energy in an applied magnetic field by rotating the magnetic moment vectors of the antiferromagnetically coupled ferromagnetic free layers. More specifically, assuming that a first magnetic field $H_{BL}$ of a first current line (e.g. bit line) and a second magnetic field $H_{WL}$ of a second current line (e.g. word line) respectively arrive at an MRAM cell for the switching thereof, and that antiferromagnetically coupled magnetizations $M_1$ and $M_2$ of the free layers are inclined at a 45° angle to the word and bit lines, respectively, a timed switching pulse sequence of magnetic fields to be applied in a typical "toggling write" mode is as follows. At a time $t_0$ neither a word line current nor a bit line current are applied resulting in a zero magnetic field $H_0$ of both $H_{BL}$ and $H_{WL}$. At a time t1, the word line current is increased to $H_1$ and magnetic moment vectors $M_1$ and $M_2$ begin to rotate either clockwise or counter-clockwise, depending on the direction of the word line current. At a time $t_2$, the bit line current is switched on, where it is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point in time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa, depending on the initial switching ("toggling") state.

In order to successfully switch an MRAM cell, in a coordinate plane spanned by $H_{WL}$ and $H_{BL}$, it is a first precondition that a magnetic field sequence applied thereon results in a magnetic field path crossing a diagonal line spanned between a first critical value (called "spin-flop magnetic field" $H_{SF}$ or "toggling point (T)") for initiating toggle switching and a second critical point (called "saturation magnetic field" $H_{SAT}$) where antiferromagnetic coupling between ferromagnetic free layers is nullified. It is further a second precondition that the magnetic field sequence circles around the spin-flop magnetic field, since only in this case magnetic moment vectors $M_1$ and $M_2$ are rotated past their hard axis instability points.

In view of modem portable equipment, such as portable computers, digital still cameras and the like, requiring very large memory performance, one of the most important issues for MRAM cells is a down-sizing thereof. However, in the case of antiferromagnetically coupled free layers, such down-sizing results in a dramatic increase of antiferromagnetic coupling forces therebetween.

Referring to FIG. 1, a patterned layered stack of a conventional MRAM memory element is depicted including antiferromagnetically coupled ferromagnetic free layers. In such structure, on a metallic base material 1 which typically is connected to an active structure of a semiconductor substrate (not shown), a ferromagnetic reference region 2, a tunneling barrier 3 made of a non-magnetic material, and a ferrommagnetic free region 4 including ferromagnetic free layer 5 and ferromagnetic free layer 6 separated by a relatively thick spacer layer 7 are provided. The reference region 2 has a fixed (pinned) magnetization adjacent the tunneling barrier layer 3, while the free region 4 includes ferromagnetic free layers 5, 6 having free magnetizations 8, 9 that are antiferromagnetically coupled and can be switched in parallel or anti-parallel alignment as to the fixed magnetization. Optionally, an underlayer 10 is arranged below the reference layer region 2 and a a cap layer 11 is arranged above the ferromagnetic free layer region 4.

The ferromagnetic free region 4 which includes ferromagnetic free layers 5, 6 and spacer layer 7 are assumed to have height r. As can be shown by numeric simulations which need not be further detailed here, a relationship between a varied thickness of spacer layer 7 (resulting in a change of magnetic free region height r) and spin-flop magnetic field as well as saturation magnetic field for toggle switching is established. Accordingly, decreasing a spacer layer 7 thickness (which is a decrease of height r) results in an increase of both spin-flop and saturation magnetic fields due to an increase of magnetic dipole coupling energy being proportional to $\ln(r)$. Hence, in order to avoid high switching currents for toggling the ferromagnetic free layers, a thick spacer layer 7 is preferred. However, as noted above, this is detrimental to down-scaling of the memory cells.

SUMMARY OF THE INVENTION

In light of the above, it is an object of the invention to provide a magnetoresistive memory element allowing a memory element size down-scale without thereby causing severe problems as to an increase of the coupling energy between antiferromagnetically coupled ferromagnetic free layers of the ferromagnetic free region.

In accordance with the invention, a magnetoresistive memory element includes a stacked structure with a ferromagnetic reference region comprising a fixed magnetization; a ferromagnetic free region including a free magnetization that is free to be switched between oppositely aligned directions with respect to an easy axis thereof, and a tunneling barrier made of a non-magnetic material. The ferromagnetic reference and free regions and the tunneling barrier together form a magnetoresistive tunneling junction. The ferromagnetic free region includes a plurality of N ferromagnetic free layers being magnetically coupled such that magnetizations of adjacent ferromagnetic free layers are in antiparallel alignment, where N is an integer greater than or equal to two. The ferromagnetic free region further includes at least one ferromagnetic decoupling layer including frustrated magnetization in orthogonal alignment to ferromagnetic free layer magnetizations and being arranged in between adjacent ferromagnetic free layers.

In an exemplary embodiment of the invention, a magnetoresistive memory element comprises a layered structure (e.g., stack of layers) including a tunneling barrier made of a non-magnetic material, a ferromagnetic reference region and a ferromagnetic free region. The ferromagnetic reference region includes a fixed magnetization arranged on one side and adjacent the tunneling barrier. The ferromagnetic free region includes a free magnetization arranged on an opposite side and adjacent the tunneling barrier that is free to be switched between oppositely aligned directions along a magnetic easy axis thereof, where the latter one typically is chosen to be in parallel alignment as to the above fixed magnetization. In such memory element, the tunneling barrier and the ferromagnetic free and reference regions that are arranged on both sides of the barrier together form a magnetoresistive tunneling junction (MTJ). Further in such memory element, the ferromagnetic free region comprises a plurality of N ferromagnetic free layers which are magnetically coupled, where N is an integer greater than or equal to two, wherein magnetic coupling of the ferromagnetic free layers results in an antiparallel alignment of adjacent ferromagnetic free layers.

In one embodiment of the invention, at least one ferromagnetic decoupling layer, preferably without any magnetic anisotropy, is arranged in between adjacent ferromagnetic free layers of the ferromagnetic free region which, due to antiparallel alignment of magnetizations of adjacent ferromagnetic free layers, has frustrated magnetization in orthogonal alignment as to the ferromagnetic free layer magnetizations.

By inserting the ferromagnetic decoupling layer in between each pair of adjacent ferromagnetic free layers, direct magnetic exchange coupling between adjacent ferromagnetic free layers is inhibited or screened such that decoupling of ferromagnetic free layers with respect to magnetic exchange coupling can be achieved. Otherwise, magnetic stray field coupling between adjacent ferromagnetic free layers is maintained to result in an antiparallel alignment of the magnetizations thereof. Accordingly, in the memory element of the invention, due to a reduced or even lacking magnetic exchange coupling, no conventional "antiferromagnetic" coupling between ferromagnetic free layers (as is typical in conventional synthetic antiferromagnets) is observed, while "antiparallel" magnetic coupling occurs therebetween due to magnetic stray field coupling. Hence, by inserting the decoupling layer in between adjacent ferromagnetic free layers, a reduction of magnetic dipole interaction of adjacent ferromagnetic free layers can advantageously be achieved to result in reduced switching fields and, thus, switching currents for toggle switching thereof. More specifically, by inserting the decoupling layer between adjacent ferromagnetic free layers, in a coordinate plane spanned by $H_{WL}$ and $H_{BL}$ as described above, spin-flop magnetic field $H_{SF}$ or toggling point T to be circled around for toggle switching can be shifted to be closer to the coordinate plane's origin, while the saturation magnetic field $H_{SAT}$ typically remains unchanged or is even increased. Therefore, while switching currents are reduced, a write margin thereof as defined by a relative distance of spin-flop and saturation fields advantageously is increased.

It is preferred to arrange a conventional spacer layer in addition to the decoupling layer in between adjacent ferromagnetic free layers. In such structure it is even more preferred that the decoupling layer is sandwiched in between two adjacent spacer layers that preferably can have the same thickness. Additionally, thickness of spacer layers preferably is chosen to be thick enough to inhibit direct magnetic exchange coupling between spacer layers and ferromagnetic free layers respectively being adjacent thereto.

According to the invention, the decoupling layer is preferably thin enough to act only as a screening layer for magnetic dipole interaction of adjacent ferromagnetic free layers. Hence, decoupling layer thickness preferably is chosen to be smaller than a total thickness of the ferromagnetic free layers. Even more preferably, a decoupling layer thickness is chosen to be smaller than a minimum thickness of each of the ferromagnetic free layers, in other words the decoupling layer thickness is chosen to be smaller than the smallest thickness of each one of the ferromagnetic free layers.

The magnetoresistive memory element according to the invention described above can also comprise a further ferromagnetic offset field layer that has magnetization adapted to shift a toggling point for switching of the free magnetization toward a smaller spin-flop magnetic field $H_{SF}$. To achieve this effect, the ferromagnetic offset field layer may for instance exhibit a magnetic moment vector along an easy axis direction of the ferromagnetic free layers. Compared to a situation where no decoupling layer is present, in the present invention a smaller built-in magnetic offset field can be used to achieve a same result in terms of reduced magnetic switching fields. Accordingly, detrimental effects of additional built-in magnetic offset fields can be reduced or even avoided, such as generation of in-homogenous magnetic stray fields that lead to reduced write margins, and reduction of activation energy and thus thermal stability of the memory element. Moreover, built-in magnetic offset fields cannot easily combined with "stop on alumina-processes (SOA)", while such combination is easily possible in the case of decoupling layers.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

PREFERRED EMBODIMENTS OF THE INVENTION

Figure 1:
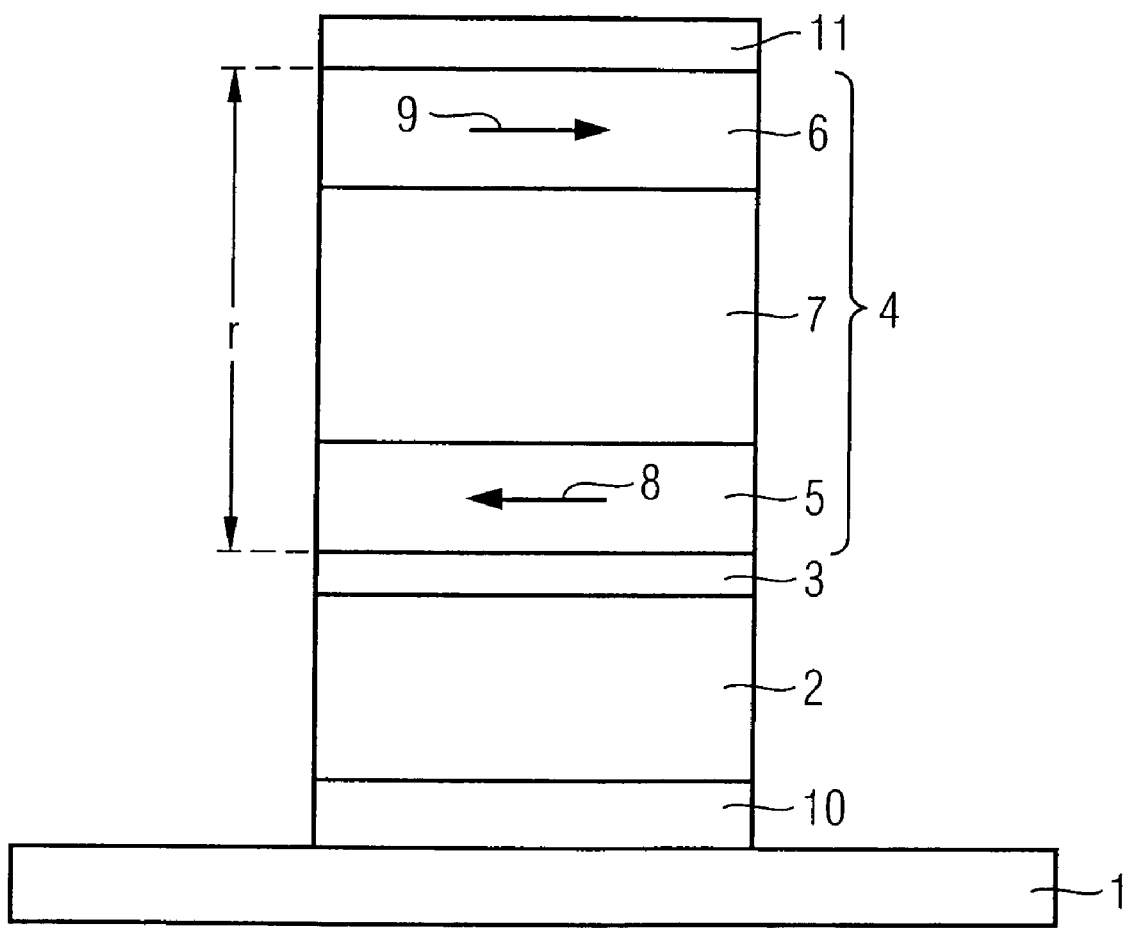
FIG. 1 depicts a stacked structure of a conventional MRAM element.
Figure 2:
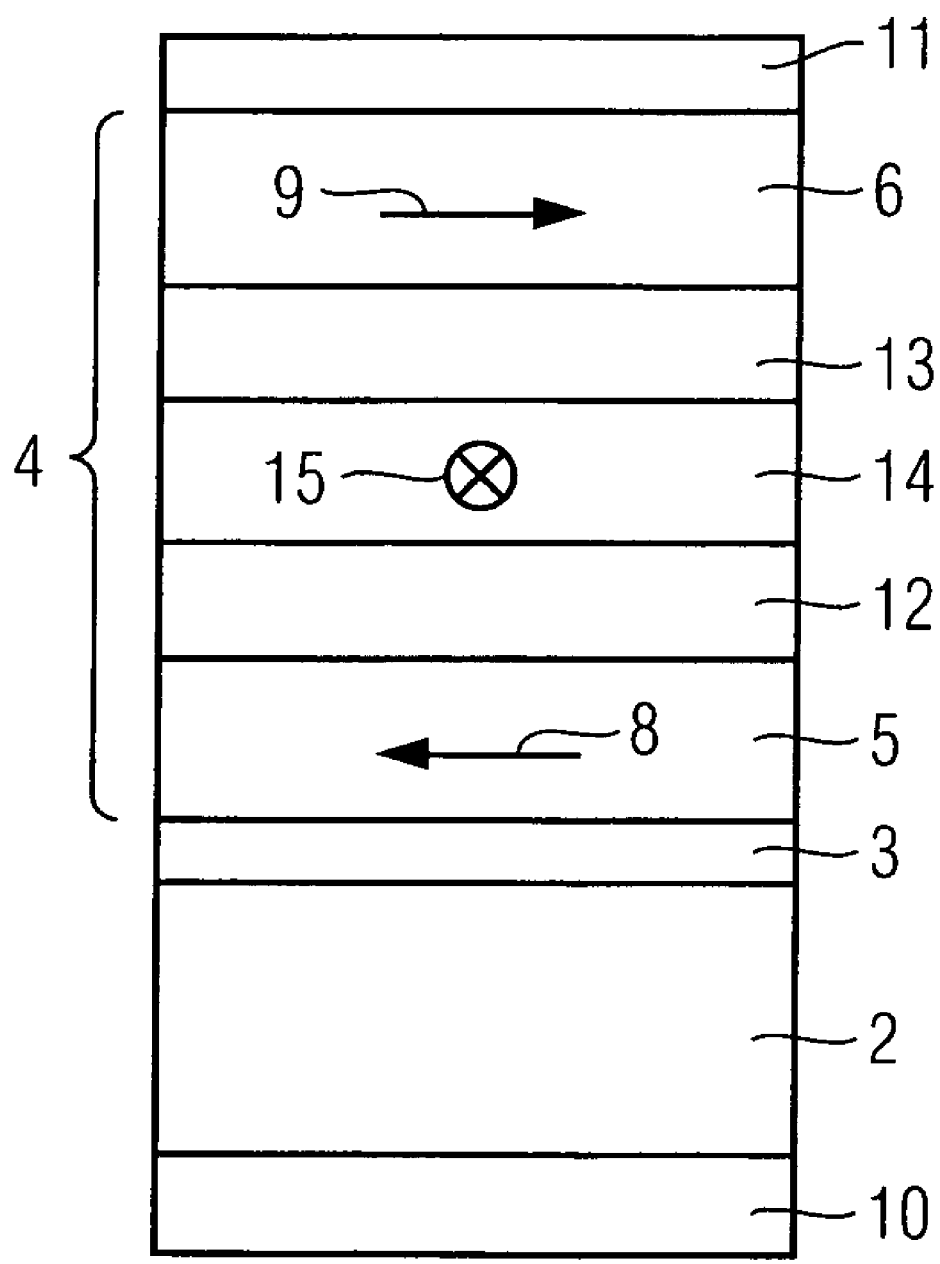
FIG. 2 depicts a stacked structure of an MRAM element according to the invention.

An exemplary embodiment of a memory element in accordance with the invention is depicted in FIG. 2. A patterned layered stack includes a tunneling barrier 3 including at least one tunneling barrier layer made of a nonmagnetic material, a ferromagnetic reference region 2 and a ferromagnetic free region 4. The ferromagnetic reference region 2 includes a fixed magnetization arranged on one side and adjacent the tunneling barrier 3. The ferromagnetic free region 4 includes a free magnetization arranged on an opposite side and adjacent the tunneling barrier 3 and is free to be switched between oppositely aligned directions along a magnetic easy axis thereof, which typically is chosen to be in parallel alignment as to the fixed magnetization. The tunneling barrier 3 and the ferromagnetic reference and free regions 2, 4 together form a magnetoresistive tunneling junction. The ferromagnetic free region 4 includes two ferromagnetic free layers 5, 6 which are magnetically coupled. Optionally, an underlayer 10 is arranged below the ferromagnetic reference region 2 and a cap layer 11 is arranged above the ferromagnetic free region 4.

In the memory element of the invention, as exemplified in FIG. 2, a ferromagnetic decoupling layer 14 without any magnetic anisotropy is arranged in between adjacent ferromagnetic free layers 5, 6 of the ferromagnetic free region 4. More particularly, decoupling layer 14 is sandwiched in between two spacer layers 12, 13 that preferably have the same thickness. Due to antiparallel alignment of magnetizations 8, 9 of adjacent ferromagnetic free layers 5, 6, which in FIG. 2 are pointing to the left and the right, respectively, magnetization 15 of the decoupling layer 14 is frustrated to then have an orthogonal direction as to the ferromagnetic free layer magnetizations 8, 9 which, for example, points into the plane of the illustration depicted in FIG. 2. Alternatively, the orthogonal direction could also come out of the plane of the illustration of FIG. 2. The specific arrangement of the ferromagnetic decoupling layer 14 in between adjacent ferromagnetic free layers 5, 6 results in decoupling of ferromagnetic free layers 5, 6 with regard to magnetic exchange coupling only, while magnetic stray field coupling between adjacent ferromagnetic free layers 5, 6 is kept to thereby result in antiparallely aligned magnetizations 8, 9 of the ferromagnetic free layers 5, 6.

In FIG. 2, the thickness of decoupling layer 14 is preferably selected to be smaller than a total thickness of the ferromagnetic free layers 5, 6, and, even more preferably, is selected to be smaller than a minimum thickness of each one of the ferromagnetic free layers 5, 6.

Decoupling layer 14 can be made of any ferromagnetic material as long as it is soft-magnetic. Accordingly, decoupling layer 14 can for instance be made of a metallic alloy including one or more of Co, Ni, Fe, and, can for example consist of Permalloy (Py). Ferromagnetic free layers 5, 6 may for instance be made of one or more materials selected from NiFe, CoFeB and CoFe/Py, and, underlayer 10 may for instance be made of one or more materials selected from TaN/NiFeCr, Ru, Ta, NiFeCr and Ta/TaN/Ru. Ferromagnetic reference region 2 may for instance include a first sublayer for example made of one or more materials selected from Co/CoTb and CoFe/Ru/CoFe/CoFeB and a second sublayer for example made of one or more materials selected from PtMn, Ru, TaN/Ta/PtMn and Ru/NiFeCr/PtMn to enable a fixed magnetization. The tunneling barrier 3 may for instance be made of one or more materials selected from $Al_2O_3$, MgO and BN. In case a ferromagnetic offset field layer is present, such offset field layer may for instance be made of one or more materials selected from CoFeB, NiFe and CoFe/Ru/CoFeB. All above materials are given as examples only, for which reason the present invention is not intended to be limited thereto.

As specific example, in FIG. 2, ferromagnetic layers 5, 6 are made of CoFeB each one having a thickness of about 30 Angstroms, while decoupling layer 14 is made of NiFe having a thickness of about 4 Angstroms.

Figure 3A:
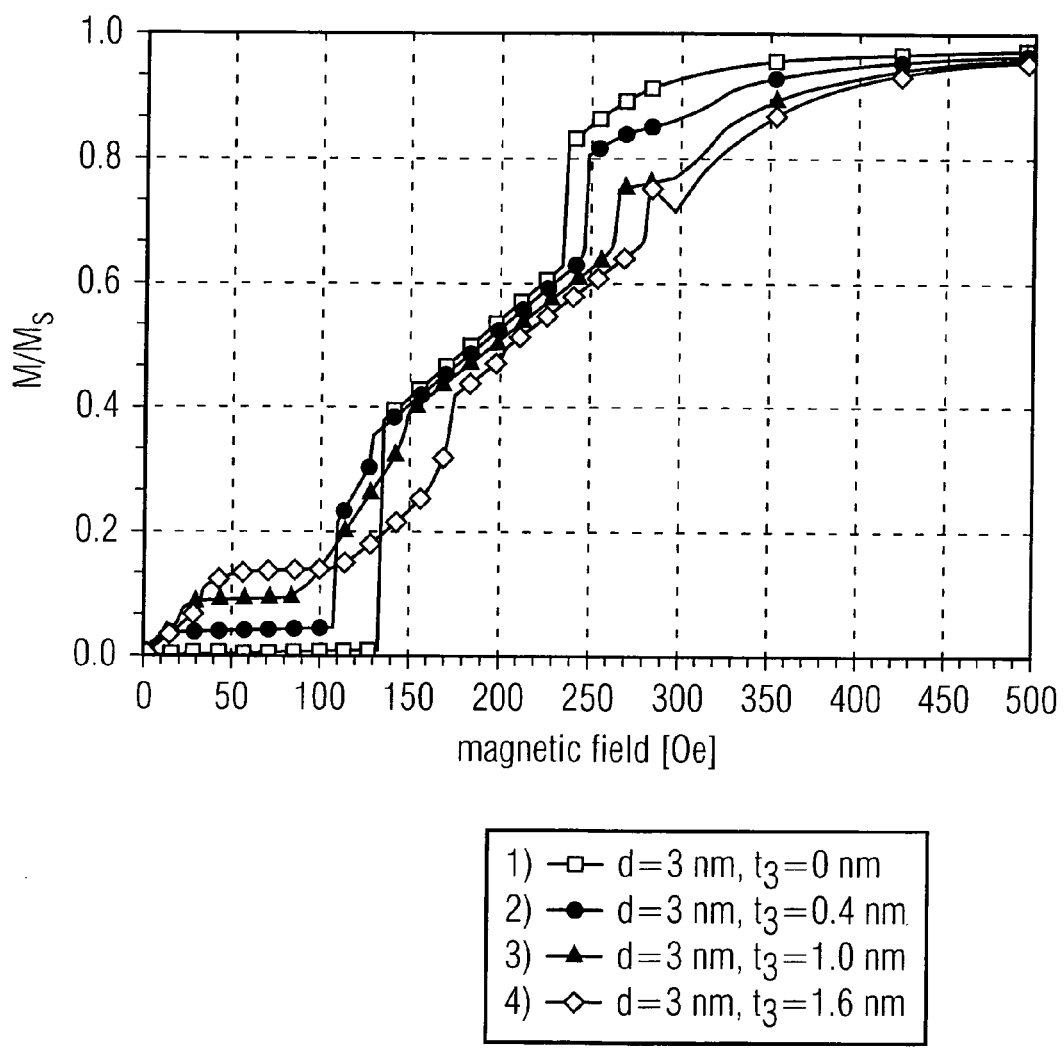
FIGS. 3A–3C illustrate a numeric simulation of an embodiment of an MRAM element of the invention.
Figure 3B:
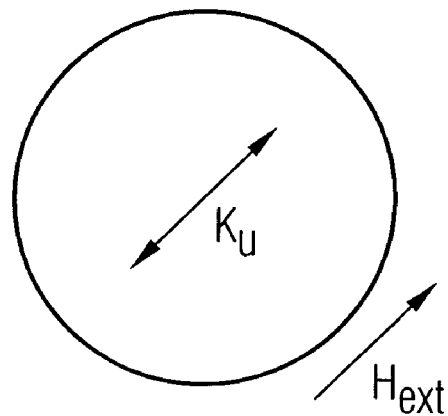
Figure 3C:
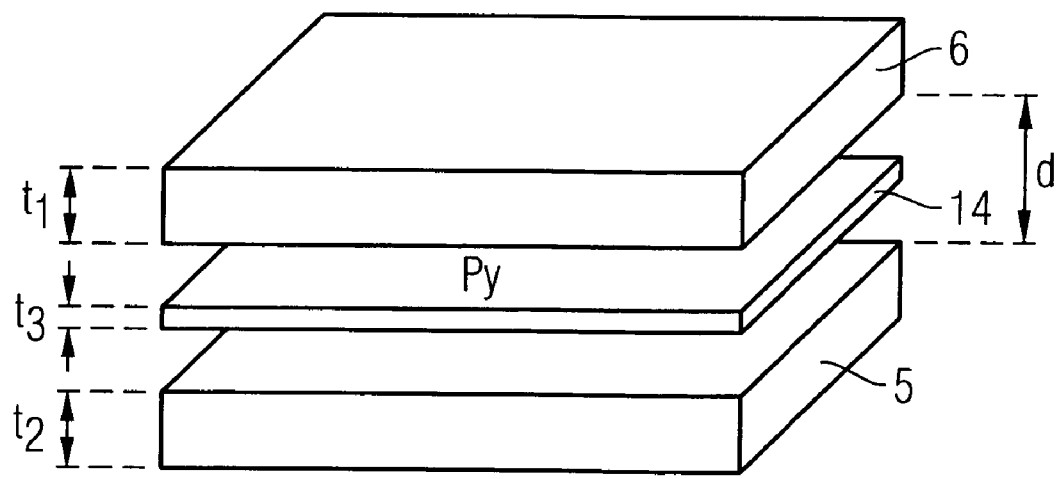

Reference is now made to FIGS. 3A to 3C illustrating a numeric simulation of an embodiment of an MRAM element of the invention.

As shown in FIG. 3C, for the numeric simulation, a thin Py (NiFe) decoupling layer 14 having thickness $t_3$ is sandwiched in between two spacer layers (not shown in FIG. 3C) and is arranged in between a lower ferromagnetic free layer 5 having thickness $t_2$ and an upper ferromagnetic free layer 6 having thickness $t_1$. Parameter d, as shown in FIG. 3C, is a total thickness of decoupling layer 14 and spacer layers (not illustrated).

FIG. 3C further illustrates a top view of a round MTJ element with anisotropy direction of ferrmagnetic layers (5, 6). In remanence with the two ferromagnetic free layers, the magnetizations of which are set to the anti-parallel state, it is energetically most favorable for the magnetization in the decoupling layer to lie perpendicular to magnetizations of both ferromagnetic free layers (frustration). If a magnetic field is applied along the easy axis of this remanent state, the Py interlayer (decoupling layer) magnetization starts to rotate along the field direction. Such rotation can be seen as a gradual increase in net moment at low fields (<50 Oe depending on the Py thickness). Once this process is finished, nothing happens until the two ferromagnetic free layers make the spin flop.

In FIG. 3A, a diagram is depicted showing magnetization loops with different field scales along the easy axis of a ferromagnetic free layer/spacer/Py decoupling layer/spacer/ferromagnetic free layer system. More particularly, in FIG. 3A, net moment of the MTJ cell is plotted against an external magnetic field. In such numeric simulation, the following parameters are chosen: $t_1=t_2=2.6$ nm, $t_3$ as given in the legend, and, d=3 nm.

Accordingly, it can be seen (curve defined by open squares vs. curve defined by solid dots) that the spin flop occurs at lower magnetic fields if the Py layer is present. Also the second critical field (saturation field) is reached at somehow higher fields than without the Py intermediate layer present. Accordingly, the operational window as defined above would increase while the spin flop field would be decreased. Thicker Py decoupling layers 8 (curves defined by closed triangles and open diamonds, where $t_3>0.4$ nm) seem to have an adverse effect since they smear out the transition regions and the spin flop field becomes less distinguishable.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A magnetoresistive memory element including a stacked structure comprising:
   a ferromagnetic reference region including a fixed magnetization;
   a ferromagnetic free region including a free magnetization that is free to be switched between oppositely aligned directions with respect to an easy axis thereof; and
   a tunneling barrier comprising a non-magnetic material; wherein:
   the ferromagnetic reference and free regions and the tunneling barrier together form a magnetoresistive tunneling junction;
   the ferromagnetic free region comprises a plurality of N ferromagnetic free layers being magnetically coupled such that magnetizations of adjacent ferromagnetic free layers are in antiparallel alignment, where N is an integer greater than or equal to two; and
   the ferromagnetic free region further comprises at least one ferromagnetic decoupling layer including frustrated magnetization in orthogonal alignment to ferromagnetic free layer magnetizations and being arranged in between adjacent ferromagnetic free layers.

2. The magnetoresistive memory element of claim 1, further comprising at least one spacer layer in between adjacent ferromagnetic free layers.

3. The magnetoresistive memory element of claim 2, wherein the decoupling layer is sandwiched in between adjacent spacer layers.

4. The magnetoresistive memory element of claim 3, wherein the adjacent spacer layers sandwiching the decoupling layer have approximately the same thickness.

5. The magnetoresistive memory element of claim 1, wherein the decoupling layer has a thickness that is smaller than a total thickness of the ferromagnetic free layers.

6. The magnetoresistive memory element of claim 1, wherein the decoupling layer has a thickness that is smaller than a minimum thickness of each of the ferromagnetic free layers.

7. The magnetoresistive memory element of claim 1, further comprising a ferromagnetic offset field layer including a magnetization configured to shift a toggling point for switching of the free magnetization toward a smaller spin-flop magnetic field ($H_{sf}$).

* * * * *

UNITED STATES PATENT AND TRADEMARK OFFICE
CERTIFICATE OF CORRECTION

PATENT NO.         : 7,205,596 B2
APPLICATION NO. : 11/117713
DATED                 : April 17, 2007
INVENTOR(S)       : Klostermann et al.

It is certified that error appears in the above-identified patent and that said Letters Patent is hereby corrected as shown below:

On title page item (73) Assignees:  Should read

Infineon Technologies AG, Neubiberg (DE)
Altis Semiconductor SNC, Corbeil Essonnes (FR)

Signed and Sealed this

Second Day of December, 2008

JON W. DUDAS
*Director of the United States Patent and Trademark Office*